(12) United States Patent
Okubo et al.

(10) Patent No.: US 6,851,872 B1
(45) Date of Patent: Feb. 8, 2005

(54) SUBSTRATE PROCESSING APPARATUS AND SUBSTRATE PROCESSING METHOD

(75) Inventors: Kenichi Okubo, Kumamoto-Ken (JP); Akira Kanbayashi, Kumamoto-Ken (JP)

(73) Assignee: Tokyo Electron Limited, Tokyo (JP)

( * ) Notice: Subject to any disclaimer, the term of this patent is extended or adjusted under 35 U.S.C. 154(b) by 989 days.

(21) Appl. No.: 09/706,817

(22) Filed: Nov. 7, 2000

(30) Foreign Application Priority Data

Nov. 11, 1999 (JP) ............................................ 11-321735

(51) Int. Cl.[7] ............................. G03D 5/00; B65G 49/07
(52) U.S. Cl. ......................... 396/611; 414/935; 118/52
(58) Field of Search ......................... 396/611; 414/225, 414/935, 937, 939, 940; 118/52, 500, 666

(56) References Cited

U.S. PATENT DOCUMENTS 4,985,722 A * 1/1991 Ushijima et al. ........... 396/624
5,015,177 A * 5/1991 Iwata ......................... 432/121
5,826,129 A   10/1998 Hasebe et al.
6,275,744 B1 * 8/2001 Yoshida ...................... 700/218

* cited by examiner

*Primary Examiner*—Alan Mathews
(74) *Attorney, Agent, or Firm*—Rader, Fishman & Grauer PLLC

(57) ABSTRACT

Transferring apparatus control means movement of a transferring apparatus for transferring a wafer to a resist liquid coating unit from a cooling process unit. A storage section of the transferring apparatus controller stores a coating time required for a resist film coating and a moving time required for the transfer of the wafer. When a coating start time of a resist film is inputted, the control section calculates a coating end time from the stored coating time. Further, the control section calculates time of taking out a wafer W, which is next subjected to a coating process from the cooling process unit, from the coating end time and the stored moving time. Based on the calculated time, the transferring apparatus controller instructs the transferring apparatus about timing to take out the wafer. This makes it possible to improve the throughput.

14 Claims, 11 Drawing Sheets

FIG.9A

TRANSFERRING APPARATUS 22

| (A1) STAND BY BEFORE COL | (A2) REPLACE WAFER IN COL | (A3) MOVE FROM COL TO COT | (A4) REPLACE WAFER IN COL | (A5) MOVE TO NEXT MODULE FROM COT |
|---|---|---|---|---|

RESIST LIQUID COATING PROCESS UNIT (COT) 3

| (C1) COT PROCESS | (C2) REPLACE WAFER | (C3) COT PROCESS |
|---|---|---|

FIG.9B

TRANSFERRING APPARATUS 22

| (A'1) STAND BY BEFORE COL | (A'2) REPLACE WAFER IN COL | (A'3) MOVE FROM COL TO COT | (A'4) REPLACE WAFER IN COL | (A'5) MOVE TO NEXT MODULE FROM COT |
|---|---|---|---|---|

RESIST LIQUID COATING PROCESS UNIT (COT) 3

| (C'1) COT PROCESS | (C'2) WAIT FOR REPLACEMENT OF WAFER | (C'3) REPLACE WAFER | (C'4) COT PROCESS |
|---|---|---|---|

FIG.13A

WAFER CARRIAGE 25

| (B1) STAND BY BEFORE EXTCOL | (B2) UNLOAD WAFER FROM EXTCOL | (B3) MOVE TO WEE FROM EXTCOL | (B4) REPLACE WAFER | (B5) MOVE TO IN-STAGE AFTER UNLOADING WAFER SUBJECTED TO PERIPHERAL LIGHT-EXPOSURE TO OUT-STAGE |

PERIPHERAL LIGHT-EXPOSURE APPARATUS (WEE) 24

| (W1) PERIPHERAL LIGHT-EXPOSURE PROCESS | (W2) REPLACE WAFER | (W3) PERIPHERAL LIGHT-EXPOSURE PROCESS |

FIG.13B

WAFER CARRIAGE 25

| (B'1) STAND BY BEFORE EXTCOL | (B'2) UNLOAD WAFER FROM EXTCOL | (B'3) MOVE TO WEE FROM EXTCOL | (B'4) REPLACE WAFER | (B'5) MOVE TO IN-STAGE AFTER UNLOADING WAFER SUBJECTED TO PERIPHERAL LIGHT-EXPOSURE TO OUT-STAGE |

PERIPHERAL LIGHT-EXPOSURE APPARATUS (WEE) 24

| (W'1) PERIPHERAL LIGHT-EXPOSURE PROCESS | (W'2) WAIT FOR REPLACEMENT OF WAFER | (W'3) REPLACE WAFER | (W'3) PERIPHERAL LIGHT-EXPOSURE PROCESS |

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method wherein a to-be-processed object such as a semiconductor wafer and the like is cooled by a cooling process unit in a resist film coating process and the cooled object is transferred to a resist liquid coating unit from the cooling process unit.

2. Description of the Related Art

In a semiconductor device manufacturing process, the photolithography technique is used. In this photolithography technique, a resist coating is applied on the surface of a semiconductor wafer (hereinafter simply referred to "wafer"), and the coated surface is exposed to light and developed to have a predetermined pattern. Since these processes of resist coating, light-exposure, and developing are carried out at about room temperature, a cooling process is carried out such that the temperature of the wafer is set to be substantially room temperature before these processes. Thereafter, a resist film with a predetermined pattern is formed on the wafer, and a film-forming process and an etching process are further performed, so that a circuit with a predetermined pattern is formed.

A series of these resist processes is carried out by a coating and developing process system into which, for example, a resist liquid coating unit, a developing process unit, a cooling process unit, a heating process unit, and a transferring apparatus that transfers the wafer between these units are incorporated.

In the conventional coating and developing process system, the wafer cooling process and the wafer resist liquid coating, light-exposure processing after the cooling process are executed as set forth bellow. Hereinafter, an explanation is given of the resist liquid coating as an example.

In the resist liquid coating process, there are used a resist liquid coating unit for coating a resist liquid onto a wafer, a cooling processing unit for providing a cooling process to a wafer before being subjected to the resist coating, and a transferring apparatus for transferring the wafer between these resist liquid coating unit and cooling process unit. In the resist liquid coating unit, a first wafer is subjected to a resist liquid coating process. In the cooling process unit, a cooling process is provided to a second wafer to be next subjected to the coating process. When the resist liquid coating process to the first wafer is ended, the transferring apparatus unloads the second wafer from the cooling unit, and transfers it to the resist liquid coating unit. Thereafter, the first wafer is unloaded from the resist liquid coating unit, the second wafer is transferred to the resist liquid coating unit, and the replacement of the wafer is ended.

In the light-exposure process, in addition to a light-exposure apparatus, there are used a cooling process unit and a transferring apparatus for transferring the wafer between the light-exposure unit and the cooling process unit similar to the resist liquid coating process. Then, the wafer is subjected to the cooling process before the light-exposure process. After ending the light-exposure process to the wafer in the light-exposure process, a wafer to be next subjected to the light-exposure process is taken out from the cooling process unit.

However, in the aforementioned transferring system, the resist liquid coating process and light-exposure process for each wafer are ended, and the wafer to be next subjected to the resist liquid coating process or light-exposure process is taken out from the cooling process unit and transferred. This causes a problem in which the throughput becomes worse.

SUMMARY OF THE INVENTION

An object of the present invention is to provide a substrate processing apparatus and a substrate processing method in which the throughput is improved.

In order to solve the aforementioned problem, according to the present invention, there is provided a substrate processing apparatus comprising: a cooling process unit section for performing a cooling process to a substrate; a liquid process unit section for supplying a predetermined liquid onto the substrate subjected to the cooling process to perform a liquid process; a transferring apparatus for transferring the substrate from at least the cooling process unit section to the liquid process unit; and control means for controlling the transfer of the substrate by the controlling apparatus such that a substrate, which is subjected to a next liquid process, stands by before the liquid process unit section at the time of ending the liquid process of the substrate in the liquid process unit.

According to the aforementioned structure of the present invention, the substrate, which is subjected to the next liquid process, is positioned before the liquid process unit at the time of ending the liquid process of the substrate in the liquid process unit. This makes it possible to shorten the time required or loading the substrate, which is subjected to the next liquid process after the end of the liquid process, into the liquid process unit. This also makes it possible to shorten the entire process time and to improve the throughput.

The present invention provides other substrate processing apparatus comprising: a first process unit group having cooling process unit sections for performing a cooling process to a substrate and heating process unit sections for performing a heating process to the substrate arranged in the form of multiple-stage vertical array; a second process unit group having liquid process unit sections for supplying a predetermined liquid onto the substrate to perform a liquid process arranged in the form of multiple-stage vertical array; a transferring apparatus for transferring the substrate from at least the cooling process unit section to the liquid process unit section; and control means for controlling the transfer of the substrate by the controlling apparatus such that a substrate, which is subjected to a next liquid process, stands by before the liquid process unit section at the time of ending the liquid process of the substrate in the liquid process unit.

According to the aforementioned structure of the present invention, the transfer of the substrate between the respective units of the different process unit groups is controlled such that the substrate, which is subjected to the next liquid process, is positioned before the liquid process unit at the time of ending the liquid process of the substrate in the liquid process unit. This makes it possible to shorten the time required for loading the substrate, which is subjected to the next liquid process after the end of the liquid process, into the liquid process unit. This also makes it possible to shorten the entire process time and to improve the throughput. Here, in each of the process unit groups, since the process units are arranged in the form of multiple-stage vertical array, the transfer of the substrate to the liquid process unit section of the second process unit group from the cooling process unit section of the first process unit group must be performed, for example, in not only the rotational direction but also the vertical direction. This requires a considerable amount of time in transferring the substrate by the transferring apparatus. Therefore, the present invention makes it possible to shorten the time required for loading the substrate, which is subjected to the next liquid process after the end of the liquid process, into the liquid process unit.

Moreover, the control means inputs a liquid process time required for the liquid process and a moving time required for movement of the transferring apparatus from the cooling process unit section to the liquid process unit section beforehand, when a liquid process start time of the substrate in the liquid process unit section is inputted, the control means calculates a liquid process end time from the start time and the liquid process time, and the control means calculates a moving start time of the transferring apparatus for transferring the substrate, which is subjected to the next liquid process, from the liquid process end time and the moving time to transmit the moving start time to the transferring apparatus. According to the above structure, timing to move the transferring apparatus is controlled by the control means.

Further, the liquid process unit section has an opening through which the substrate is loaded and unloaded, and an open/close shutter member for closing the opening. According to this structure, the provision of the shutter member makes it possible easy to manage the atmosphere such as temperature and humidity in the liquid process unit.

Still further, the opening is closed by the shutter member during the liquid process, and the opening is opened by the shutter member at the end of the liquid process. According to this structure, since the processing space is formed by the shutter member during the liquid process, the processing solution is prevented from being scattered to the external portion of the liquid process unit section.

The present invention provides other substrate processing apparatus comprising: a cooling process unit section for performing a cooling process to a substrate on which a resist film is formed; a light-exposure process unit section for performing a light-exposure process to the resist film of the substrate subjected to the cooling process; a transferring apparatus for transferring the substrate between at least the cooling process unit section and the light-exposure process unit section; and control means for controlling the movement of the transferring apparatus for transferring the substrate to the light-exposure process unit section from the cooling process unit section such that a substrate, which is subjected to a next light-exposure process, stands by before the liquid process unit section at the time of ending the light-exposure process of the substrate in the light-exposure process unit.

According to the aforementioned structure of the present invention, the substrate, which is subjected to the next light-exposure process, is positioned before the light-exposure process unit at the time of ending the light-exposure process of the substrate in the light-exposure process unit. This makes it possible to shorten the time required for loading the substrate, which is subjected to the next light-exposure process after the end of the light-exposure process, into the light-exposure process unit. This also makes it possible to shorten the entire process time and to improve the throughput.

The present invention provides other substrate processing apparatus comprising: a process unit group having cooling process unit sections for performing a cooling process to a substrate on which a resist film is formed, and heating process sections for performing a heating process to the substrate arranged in the form of multiple-stage vertical array; a light-exposure process unit section for performing a light-exposure process to the resist film of the substrate subjected to the cooling process; a transferring apparatus for transferring the substrate from at least the cooling process unit section to the light-exposure process unit section; and control means for controlling the transfer of the substrate by the controlling apparatus such that a substrate, which is subjected to a next light-exposure process, stands by before the liquid process unit section at the time of ending the light-exposure process of the substrate in the light-exposure process unit.

According to the aforementioned structure of the present invention, the transfer of the substrate between the cooling process unit and the light-exposure process unit section of the process unit group formed by arranging the process unit sections in the form of multiple-stage vertical array is controlled such that the substrate, which is subjected to the next light-exposure process, is positioned before the light-exposure process unit at the time of ending the light-exposure process of the substrate in the light-exposure process unit. This makes it possible to shorten the time required for loading the substrate, which is subjected to the next light-exposure process after the end of the light-exposure process, into the light-exposure process unit. This also makes it possible to shorten the entire process time and to improve the throughput.

Still further, the control means inputs a light-exposure process time required for the light-exposure process and a moving time required for movement of the transferring apparatus from the cooling process unit section to the light-exposure process unit section beforehand, when a liquid process start time of the substrate in the light-exposure process unit section is inputted, the control means calculates a light-exposure process end time from the start time and the light-exposure process time, and the control means calculates a moving start time of the transferring apparatus for transferring the substrate, which is subjected to the next liquid process, from the light-exposure end time and the moving time to transmit the moving start time to the transferring apparatus. According to the above structure, timing to move the transferring apparatus is controlled by the control means.

The present invention provides a substrate processing method comprising the step of: performing a cooling process to a first substrate in a cooling process unit section; supplying a predetermined liquid onto the first substrate subjected to the cooling process to perform a liquid process in a liquid process unit section; performing a cooling process to a second substrate in the cooling process unit section; transferring the second substrate by a transferring apparatus such that the second substrate subjected to the cooling process stands by before the liquid process unit section at the time of ending the liquid process of the first substrate; and unloading the first substrate from the liquid process unit section to load the second substrate to the liquid process unit section.

Moreover, the liquid process unit section has an opening through which the substrate is loaded and unloaded, and an open/close shutter member for closing the opening. The opening is closed by the shutter member during the liquid process, and the opening is opened by the shutter member at the end of the liquid process. According to the structure, since the processing space is formed by the shutter member during the liquid process, the processing solution is prevented from being scattered to the external portion of the liquid process unit section.

The present invention provides other substrate processing method comprising the steps of: performing a cooling process to a first substrate on which a resist film is formed in a cooling process unit section; light-exposing the resist film of the first substrate subjected to the cooling process; performing a cooling process to a second substrate on which a resist film is formed in the cooling process unit section; transferring the second substrate by a transferring apparatus such that the second substrate subjected to the cooling process stands by before the light-exposure process unit section at the time of ending the light-exposure process of the first substrate; and unloading the first substrate from the light-exposure process unit section to load the second substrate to the light-exposure process unit section.

According to the aforementioned structure of the present invention, the substrate, which is subjected to the next light-exposure process, is positioned before the light-exposure process unit at the time of ending the light-exposure process of the substrate in the light-exposure process unit. This makes it possible to shorten the time required for loading the substrate, which is subjected to the next light-exposure process after the end of the light-exposure process, into the light-exposure process unit. This also makes it possible to shorten the entire process time and to improve the throughput.

These objects, other objects and advantages of the present invention will become readily apparent by the following description and the accompanying drawings.

BRIEF DESCRIPTION OF THE DRAWINGS

FIG. 9 is a view explaining a difference in timing to transfer a wafer W between the cooling process unit and the resist liquid unit in connection with the prior art and the present embodiment;

FIG. 13 is a view explaining a difference in timing to transfer a wafer W between the extension and cooling process unit and the peripheral light-exposure apparatus in connection with the prior art and the present embodiment.

DETAILED DESCRIPTION OF THE PREFERRED EMBODIMENT

Hereinbelow, a preferred embodiment of the present invention will be described with reference to the drawings.

Figure 1:
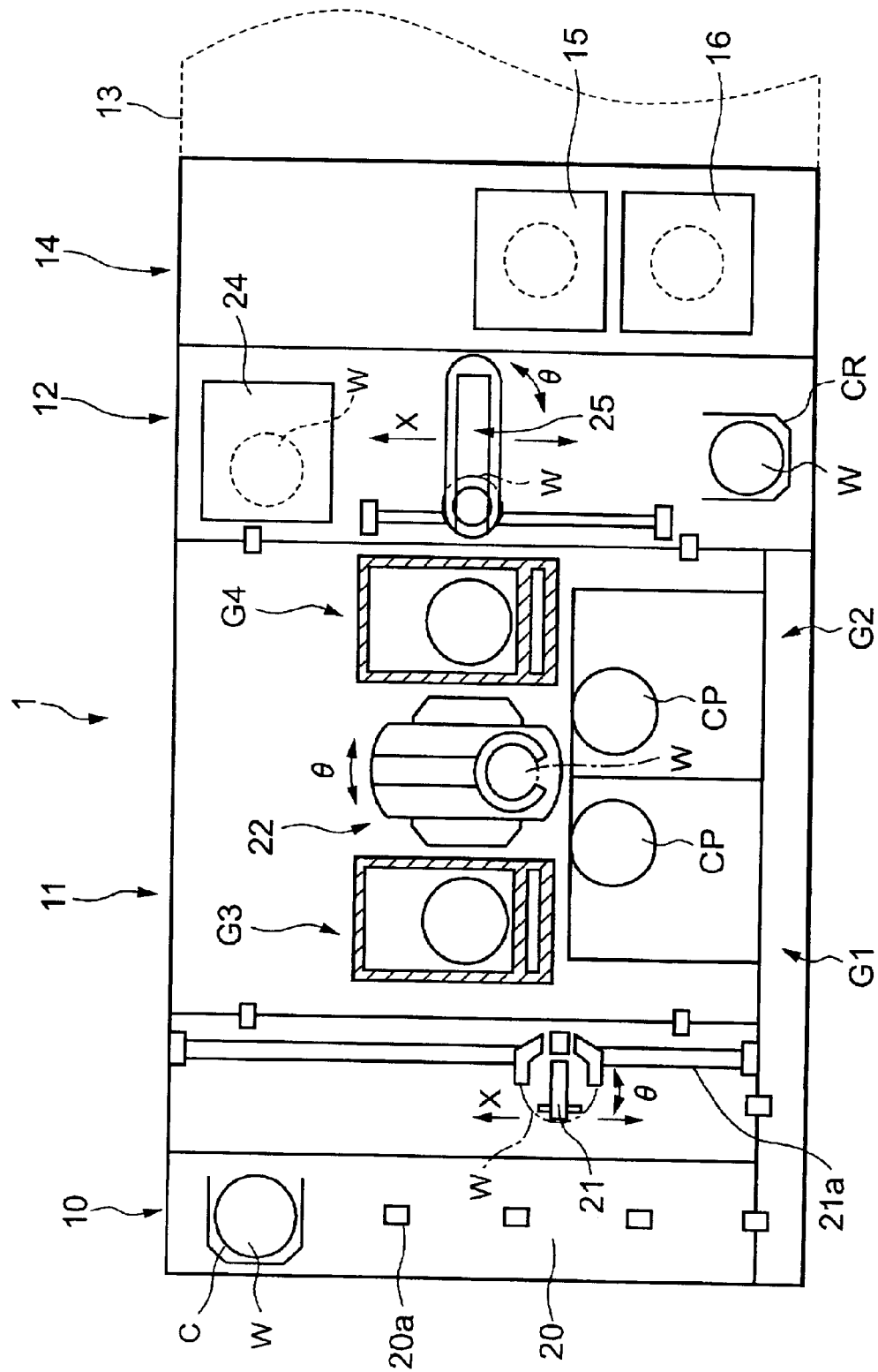
FIG. 1 is a plane view showing a coating and developing process system according to one embodiment of the present invention.
Figure 2:
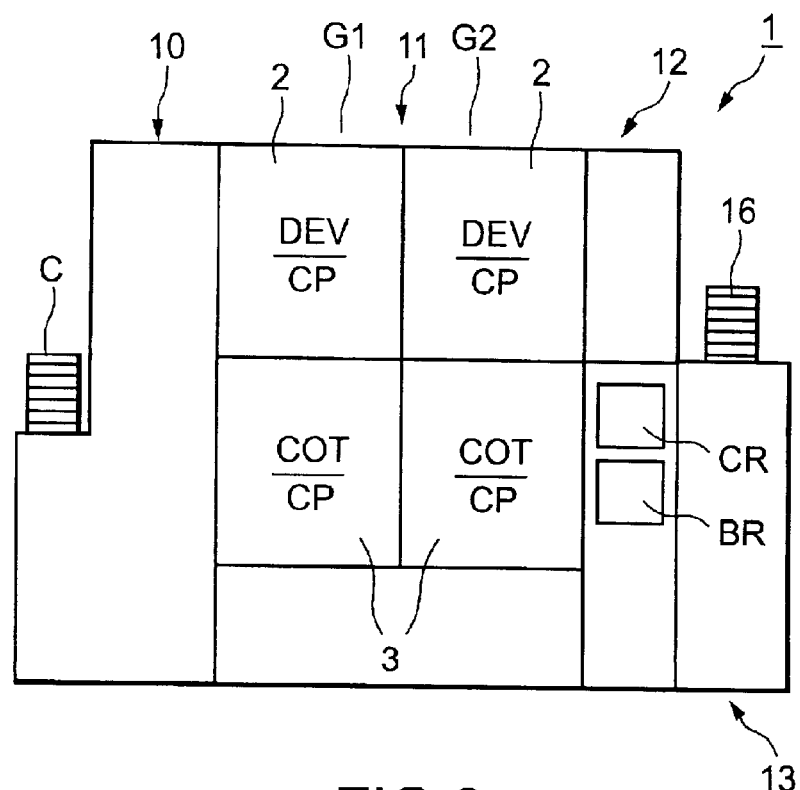
FIG. 2 is a front view showing the coating and developing process system shown in FIG. 1.

FIG. 1 is a plane view showing a coating and developing process system according to one embodiment of the present invention; FIG. 2 is a front view showing the coating and developing process system shown in FIG. 1; and FIG. 3 is a rear view showing the coating and developing process system shown in FIG. 1.

Figure 3:
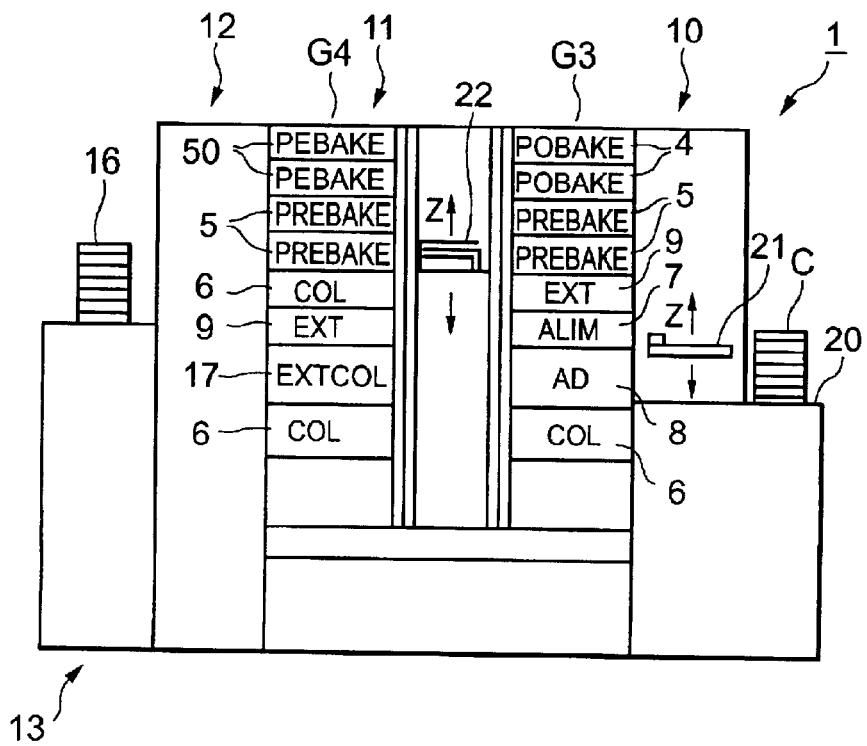
FIG. 3 is a rear view showing the coating and developing process system shown in FIG. 1.

As shown in FIGS. 1 through 3, a coating and developing process system 1 is constituted by integrally connecting a cassette station 10, a process station 11, an interface section 12, and a wafer delivering section 14. The cassette station 10 externally loads wafers W into the system 1 in units of a plurality of, e.g., 25 wafers for a wafer cassette C, and unloads them from the system externally. Also, the wafers W are loaded and unloaded in/from the wafer cassette. In the process station 11, various single-process units, which provide predetermined processes to wafers one by one in the coating and developing process system, are arranged at predetermined positions in the form of multiple-stage vertical array. A peripheral light-exposure apparatus 24 is provided in the interface section 12. In the wafer delivery section 14, an out-stage 15 and an in-stage 16 are arranged. The out-stage 15 mounts wafers W, which are not subjected to light-exposure process yet, to be transferred to a light-exposure apparatus 13 provided next to the coating and developing process system 1. The in-stage 16 mounts wafers W subjected to light-exposure process. The delivery of wafers W between the wafer delivery section 14 and the light-exposure apparatus 13 is performed by a transferring apparatus (not shown).

In the cassette station 10, as shown in FIG. 1, a plurality of, e.g., up to four cassettes C are mounted at positions of positioning projections 20a on a cassette mounting table 20 in a line along the X direction (vertical direction in FIG. 1) while directing their wafer entrances to the process station 11. A wafer carriage 21, which is movable in this cassette alignment direction (X direction) and the wafer alignment direction (Z direction; vertical direction) of the wafers W stored in the cassette C, moves freely along a wafer carrying path and selectively accesses the respective cassettes C.

The wafer carriage 21 is constituted to be rotatable in the θ direction, and can access an alignment unit (ALIM) and an extension unit (EXT) belonging to a multiple-stage unit section in a third process unit group G3 (to be described) in the process station 11.

In the process station 11, as shown in FIG. 1, a vertical transfer type transferring apparatus 22 is provided at the central portion, and one or a plurality of pairs of various process units is arranged therearound in the form of multiple-stage vertical array to constitute the process unit groups. The coating and developing process 1 is provided with four process units groups G1, G2, G3, and G4, which are arrangeable. The first and second process unit groups G1 and G2 are arranged at the front side of the system, the third process unit group G3 is set next to the cassette station 10, and the fourth process unit group G4 is set next to the interface section 12. The transferring apparatus 22 is constituted to be rotatable in the direction θ and to be movable in the Z direction, and to allow the delivery of wafers W between the respective units.

In the first process unit group G1, as shown in FIG. 2, two spinner-type process units wherein a predetermined process is applied to the wafer W mounted on a mounting table, are used. For example, a resist liquid coating unit (COT) 3 and a developing process unit (DEV) 2 are superimposed in two stages from the bottom in order. Similar to the first process unit group G1, in the second process unit group G2, two spinner-type process units, for example, the resist liquid coating unit (COT) 3 and the developing process unit (DEV) 2 are superimposed in two stages from the bottom in order. The resist liquid coating unit (COT) 3 supplies a resist liquid to the wafer W to apply a resist film thereon. The developing process unit (DEV) 2 supplies a developing solution to the wafer W to be subjected to a developing process.

The liquid process unit using these treatment liquids, for example, the resist liquid coating unit (COT) 3 has an opening 19 through which the substrate is loaded/unloaded and an open/close shutter member 18 for closing the opening 19. The open/close shutter 18 is moved up and down to allow the opening 19 to be opened/closed. During the liquid processing, the shutter member 18 is moved down to close the opening 19, so that a treatment solution is prevented from being scattered to the outside of the resist liquid coating unit 3. When the liquid process is ended and the replacement of the processing wafer in the resist coating unit 3 is directed to be carried out, the shutter member 18 is moved up to open the opening 19. In the developing process unit (DEV) 2 and a cooling process unit to be described layer, there are formed the opening through which the wafer is loaded/unloaded and the shutter member, similar to the resist liquid coating unit 2.

In the third process unit group G3, as shown in FIG. 3, there are used process units wherein a predetermined process is performed to the wafer W mounted on the mounting table. For example, a cooling process unit (COL) 6 for performing cooling process, an adhesion unit (AD) 8 for performing a so-called hydrophobic process in order to improve resist-deposition, an alignment unit (ALIM) 7 for aligning, an extension unit (EXT) 9, a pre-baking unit (PREBAKE) 5 for performing heating before a light-exposure process, and a post-baking unit (POBAKE) 4 for performing heating after developing are superimposed in, for example, eight stages from the bottom in order.

Similarly, in the fourth process unit group G4, as shown in FIG. 3, there are used oven-type process units wherein a predetermined process is performed to the wafer W mounted on the mounting table. For example, the cooling process unit (COL) 6 for performing cooling process, an extension/cooling process (EXTCOL) 17 for serving as the cooling process, the extension unit (EXT) 9, the adhesion unit (AD) 8, the pre-baking unit (PREBAKE) 5, and a post exposure baking unit (PEBAKE) 50 are superimposed in, for example, eight stages from the bottom in order.

In this way, the process units, in which processes are performed at low temperatures, such as the cooling process unit (COL) 6 and the extension/cooling process (EXTCOL) 17, are placed in the lower stages, and the process units, in which processes are performed at high temperatures, such as the pre-baking unit (PREBAKE) 5, the post-baking unit (POBAKE) 4, post exposure baking unit (PEBAKE) 50 and the adhesion unit (AD) 8, are placed in the higher stages. This makes it possible to reduce terminal interference between units.

As shown in FIG. 1, the interface section 12 has the same depth (x direction) as the process station 11 but shorter width than the process station in an axial direction. As shown in FIGS. 1 and 2, in the front portion of the interface section 12, a movable pick-up cassette CR and a fixed buffer cassette BR are arranged one on top of the other. On the other hand, in the rear portion, the peripheral light-exposure apparatus 24 is disposed.

A wafer carriage 25 is positioned in the middle of the interface section 12. The wafer carriage 25 moves in the X direction and the Y direction (vertical direction). The wafer carriage 25 is configured to be rotatable in the θ direction, so that it can access the extension unit (EXT), which belongs to the fourth unit group G4 of the process station 11, and the out-stage 15 of the wafer delivery section 14 to be described later and the in-stage 16.

In the wafer delivery section 14, the out-stage 15 is positioned in substantially the middle. The out-stage 15 mounts the wafer W, which is not subjected to light-exposure process yet, to be transferred to the light-exposure apparatus 13 provided next to the coating and developing process system 1. The in-stage 16 is positioned on the front side of the wafer delivery section 14 provided next to the out-stage 15. The in-stage 16 mounts the wafer W subjected to light-exposure process. The delivery of wafers W between the wafer delivery section 14 and the light-exposure apparatus 13 is performed by a transferring apparatus (not shown).

Figure 4:
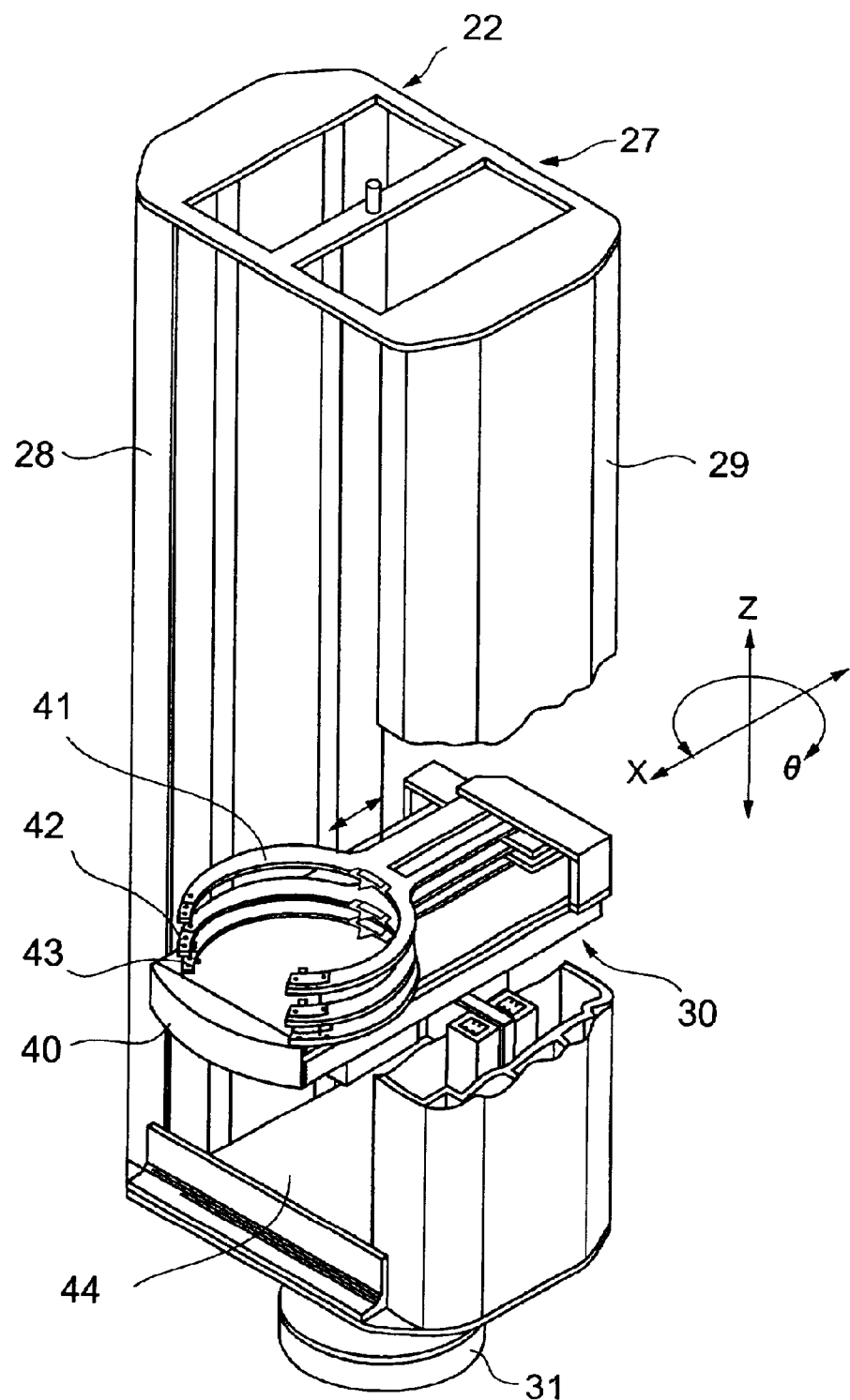
FIG. 4 is a perspective view of a transferring apparatus.

FIG. 4 is a perspective view showing the outline of a transferring apparatus 22. The transferring apparatus 22 has a wafer transferring apparatus 30 in a cylindrical support member 27 constituted by a pair of vertical walls 25 and 26, which are connected to each other at the upper and lower ends to oppose each other. The transferring apparatus 22 can move up and down in the vertical direction (Z direction). Since the cylindrical support member 27 is coupled to the rotating shaft of a motor 31, the cylindrical support 27 is rotated about the rotating shaft together with the wafer transferring apparatus 30 by the rotation driving force of the motor 31. Therefore, the wafer transferring apparatus 30 is rotatable in the θ direction. On a transfer base 40 of the wafer transferring apparatus 30, there are provided tweezers, for example, three. Each of tweezers 41, 42, 43 has a shape and a size that allow it to pass through a side surface opening portion 44 between the vertical walls 25 and 26 of the cylindrical support member 27. These tweezers are designed to be rotatable in the X direction. Then, the transferring apparatus 22 accesses the process station around which tweezers 41, 42, 43 are arranged to perform the delivery of wafer W to/from the process station.

The movement of transferring apparatus 22 is controlled by controller to be described later, and timing to transfer the wafer W is also managed by the controller to be described later.

Figure 5:
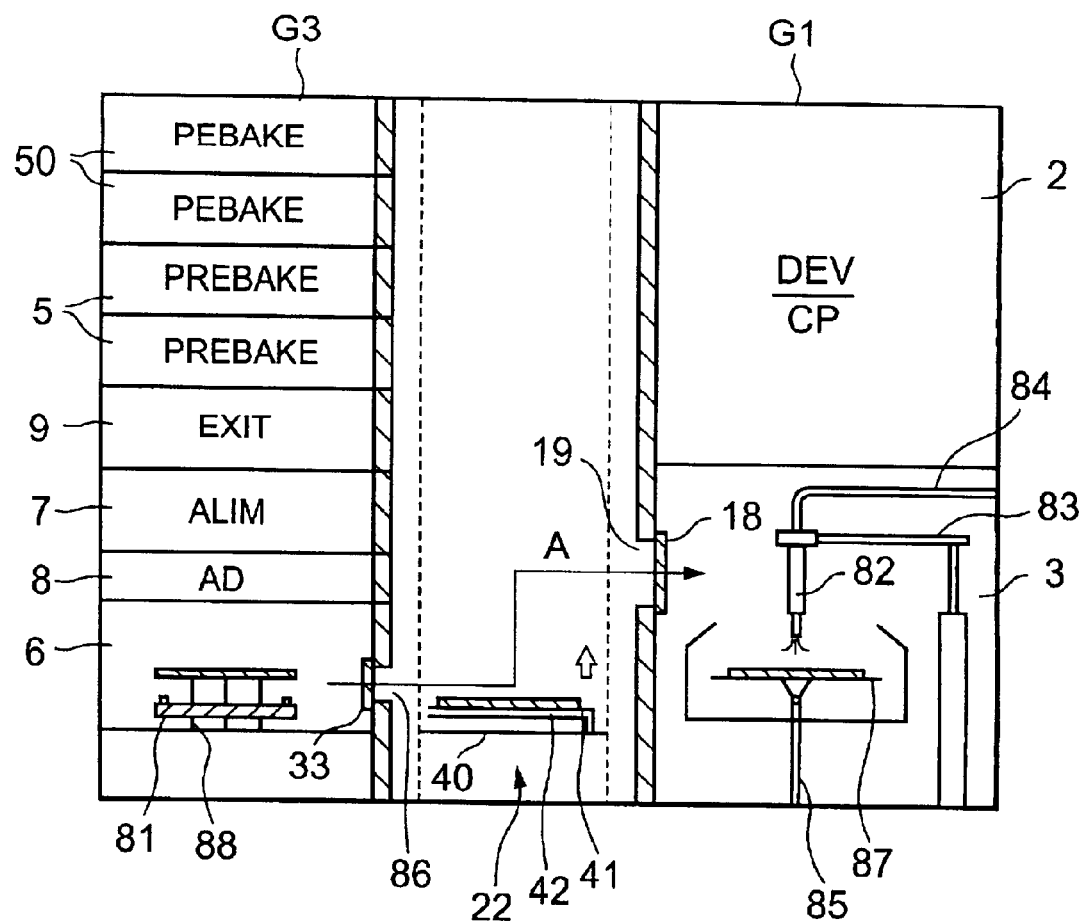
FIG. 5 is a cross-sectional view of the coating and developing process system to explain the transfer of a wafer between a cooling process unit and a resist liquid coating unit.

FIG. 5 is a view explaining the transfer of wafer W between the first process unit group G1 and the third process unit group G3. FIG. 5 specifically illustrates the structure of the cooling process unit (COL) 6 and that of the resist liquid coating unit (COT) 3 particularly among the plurality of units. As illustrated in the figure, the resist liquid coating unit (COT) 3 is positioned at the lowest stage of the first process unit group G1, and the cooling process unit (COL) 6 is positioned at the lowest stage of the second process unit group G2. In FIG. 5, the number of tweezers placed on the transferring base is two.

As is illustrated in FIG. 5, the resist liquid coating unit (COT) 3 is provided with a spin chuck base 87 for providing spin chuck to the wafer W in the cup CP and a hoisting and lowering mechanism 85 for moving the spin chuck base 87 up and down. Moreover, a dispenser 82 for dispensing a resist liquid to the wafer W, and a moving mechanism 83 for allowing the dispenser 82 to be movable horizontally, and a resist supply path 84 for supplying the resist liquid to the dispenser 82 from a resist liquid containing section placed at a unit external portion (not shown) are provided thereto. The dispenser 82 is movable up to the outside of the cup CP from the portion close to the center of the upper portion of the wafer. The dispenser 82 is positioned at the portion close to the center of the upper portion of the wafer at a resist liquid coating time and is positioned at the outside of the cup CP at the other time. The resist liquid coating unit (COT) has the opening 19 through which the wafer W is loaded and unloaded and the shutter member 18, which is movable up and down, for closing the opening 19. At the resist liquid coating time, the shutter member 18 is moved down to close the opening and to form a processing space. At a wafer replacing time, the shutter member 18 is moved up and the spin chuck base is also moved up so as to load/unload the wafer W through the opening. The loading/unloading of wafer W is carried out by horizontal movement of the tweezers 41 and 42 placed on the transfer base 40 of the transferring apparatus 22.

While, the cooling process unit (COL) 6 is provided with a cooling plate 81 for cooling the wafer W and three pins 88, which are movable up and down, for holding the wafer W. At the time of receiving the wafer W from the transferring apparatus 22, the pins 88 are moved up and the wafer W is held by three pins. The pins 88 moved down in a state that the wafer W is held, and the pins 88 are buried in the cooling plate 81, whereby the wafer W is mounted on the cooling plate and is subjected to the cooling process. Similar to the resist liquid coating unit (COT) 3, the cooling process unit (COL) 6 has an opening 86 through which the wafer W is loaded and unloaded and a shutter member 33, which is movable up and down, for closing the opening 86. At the cooling process time, the shutter member 33 is moved down to close the opening and to form a processing space. At the wafer replacing time, the shutter member 33 is moved up so as to load/unload the wafer W through the opening. The loading/unloading of wafer W is carried out by horizontal movement of the tweezers 41 and 42 placed on the transfer base 40 of the transferring apparatus 22.

While the wafer W is transferred up to the resist liquid coating unit (COT) 3 from the cooling process unit (COL) 6, the transfer base 40 of the transferring apparatus 22 moves in the X-direction, Z-direction and θ direction, and the wafer W mounted on the transferring apparatus 22 is moved along the track indicated by an arrow A shown in FIG. 5. In addition, the extension/cooling process (EXTCOL) 17 is also provided with the cooling plate for cooling the wafer in the unit, similar to the cooling process unit (COL) 6.

Figure 6:
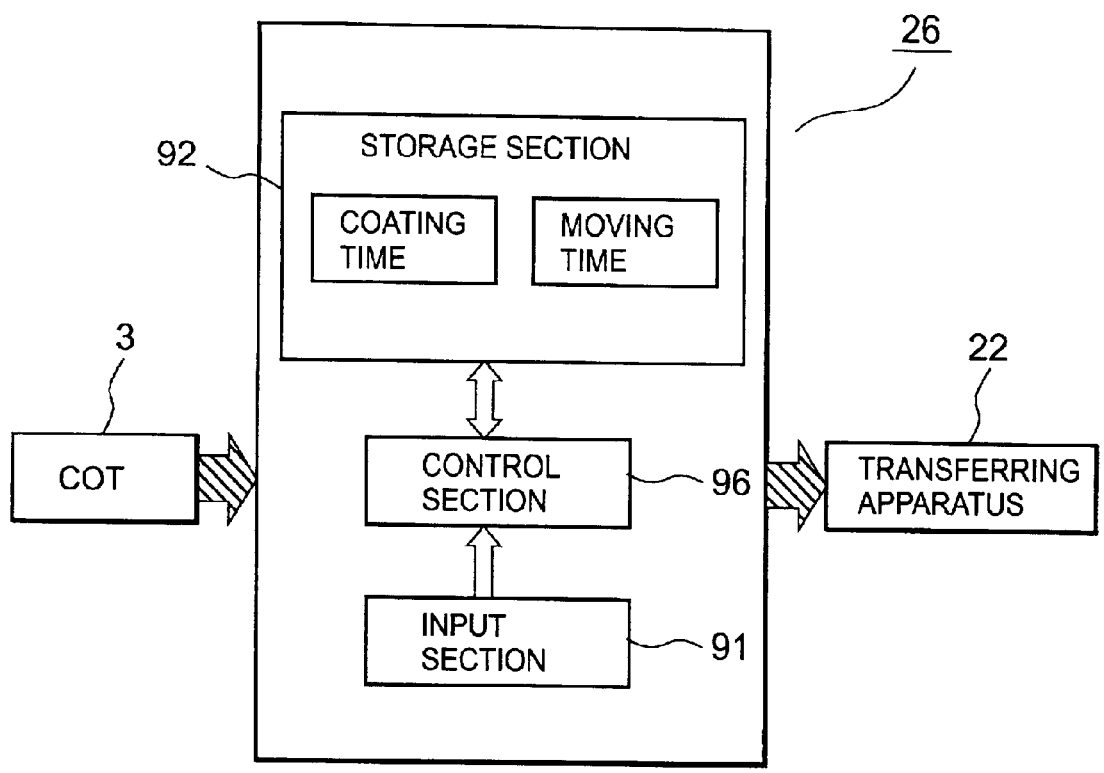
FIG. 6 is a view to explain a transferring apparatus controller.

FIG. 6 is a block diagram to explain a transferring apparatus controller 126 for controlling the transfer operation of the transferring apparatus 22 for transferring the wafer W up to the resist liquid coating unit (COT) 3 from the cooling process unit (COL) 6. As illustrated in FIG. 6, the transferring apparatus controller 126 comprises an input section 91, a storage section 92, and a control section 96.

The input section 91 consists of, for example, a keyboard. By use of the keyboard, an operator inputs time, which is required for a resist film coating (coating time in the figure) done by the resist liquid coating unit (COT) 3, beforehand. The operator also inputs a transferring apparatus moving time (moving time in the figure), which is required for transferring the wafer W before the resist liquid coating unit (COT) 3 after being taken out from the cooling process unit (COL) 6, beforehand. The moving time and coating time are stored into the storage section 92 by the control section 96. When a coating start time is input from the resist liquid coating unit (COT), the control section 96 calculates a coating end time from the coating start time and the moving time stored in the storage section 92. The control section 96 further calculates time required for taking out the wafer W, which is next subjected to the resist liquid coating process, from the cooling process unit based on the calculated coating end time and the moving time stored in the storage 92. Then, the time required for taking out the wafer W from the cooling process unit (COL) 6 is calculated such that the wafer W, which is next subjected to the coating process, stands by before the resist liquid coating unit (COT) 3 at the time of ending the coating process of wafer W in the resist liquid coating unit (COT) 3.

Figure 10:
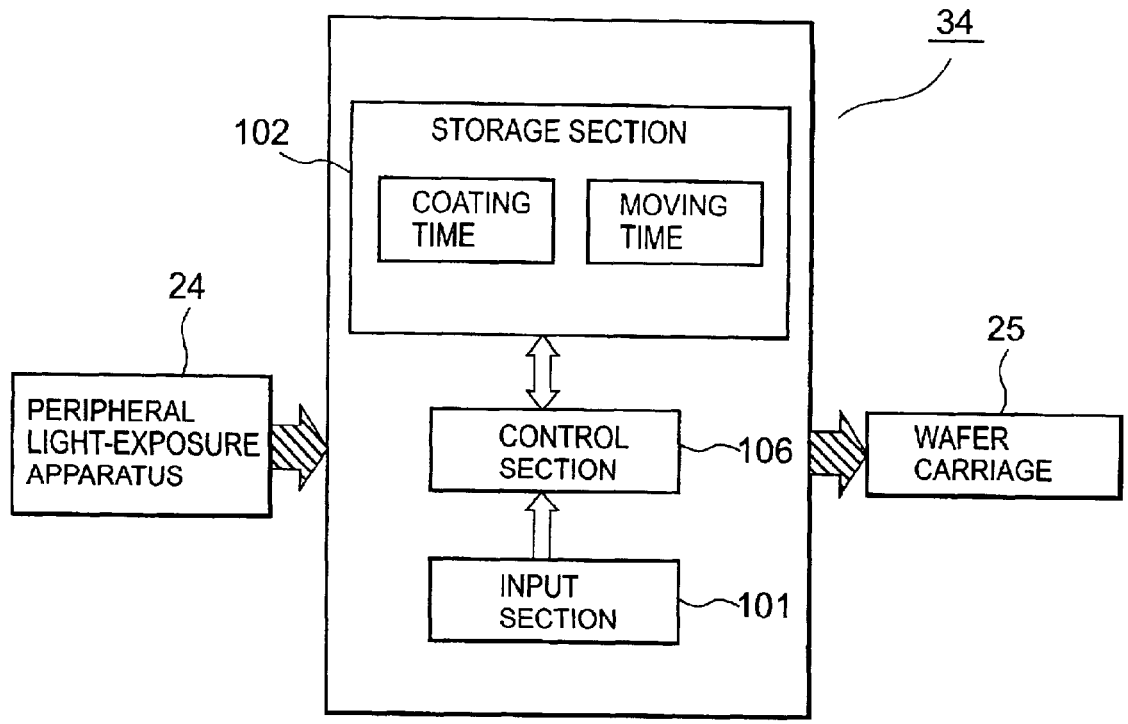
FIG. 10 is a view to explain a controller for a wafer carriage.

FIG. 10 is a block diagram to explain a wafer carriage control means 34 for controlling the transfer operation of the wafer carriage 25 for transferring the wafer W up to the peripheral light-exposure apparatus 24 from the extension/cooling process (EXTCOL) 17. As illustrated in FIG. 10, the wafer carriage 25 comprises an input section 101, a storage section 102, and a control section 106.

The input section 101 consists of, for example, a keyboard. By use of the keyboard, the operator inputs time, which is required for a peripheral light-exposure process (light-exposure time in the figure) done by the peripheral light-exposure apparatus 24, beforehand. The operator also inputs wafer carriage moving time (moving time in the figure), which is required for transferring the wafer W before the peripheral light-exposure apparatus 24 after being taken out from the extension/cooling process (EXTCOL) 17, beforehand. The moving time and light-exposure time are stored into the storage section 102 by the control section 106. When a peripheral light-exposure start time is input from the peripheral light-exposure apparatus 24, the control section 106 calculates a peripheral light-exposure start time from the peripheral light-exposure start time and the light-exposure time stored in the storage section 102. The control section 106 further calculates time required for taking out the wafer W, which is next subjected to the light-exposure process, from the cooling process unit based on the calculated peripheral light-exposure time and the moving time stored in the storage 102. Then, the control section 106 instructs the wafer carriage 25 about timing to take out the wafer W in accordance with the calculated time. The time required for taking out the wafer W from the extension/cooling process unit (EXTCOL) 17 is calculated such that the wafer W, which is next subjected to the peripheral light-exposure process, stands by before the peripheral light-exposure apparatus 24 at the time of ending the peripheral light-exposure process of wafer W in the peripheral light-exposure apparatus 24.

An explanation will be given of the processing steps in the above-structured coating and developing process system 1.

First, in the cassette station 10, one unprocessed wafer W contained in the cassette C mounted on the cassette mounting table 20 is taken out by the wafer carriage 21. After that, the wafer carriage 21 accesses the alignment (ALIM) of the third process unit group G3, and loads the wafer W into the alignment unit (ALIM) 7, and the orientation flat alignment and centering of the wafer W are performed.

After the orientation flat alignment and centering of the wafer W are completed in the alignment unit (ALIM) 7, the wafer W is transferred into the adhesion unit (AD) 8 of the third process unit group G3 by the transferring apparatus 22, and the wafer W is subjected to the hydrophobic process.

The wafer W subjected to the hydrophobic process is loaded into a predetermined pre-baking unit (PREBAKE) 5 by the transferring apparatus 22, and baked, and then loaded into a predetermined cooling process unit (COL) 6. The wafer W is cooled to a predetermined temperature, which is prior to the resist coating process, for example, 23° C.

When the cooling process is completed, the wafer W is loaded into a predetermined resist liquid coating unit (COT) 3 and the resist coating is applied onto the surface of wafer W in the resist liquid coating unit (COT) 3.

The wafer W subjected to the cooling process is transferred such that the wafer W stands by before the same resist liquid coating unit (COT) 3 at the time of ending the resist-film coating to the wafer previously subjected to the resist-film coating process in the resist liquid coating unit (COT) 3.

Figure 7:
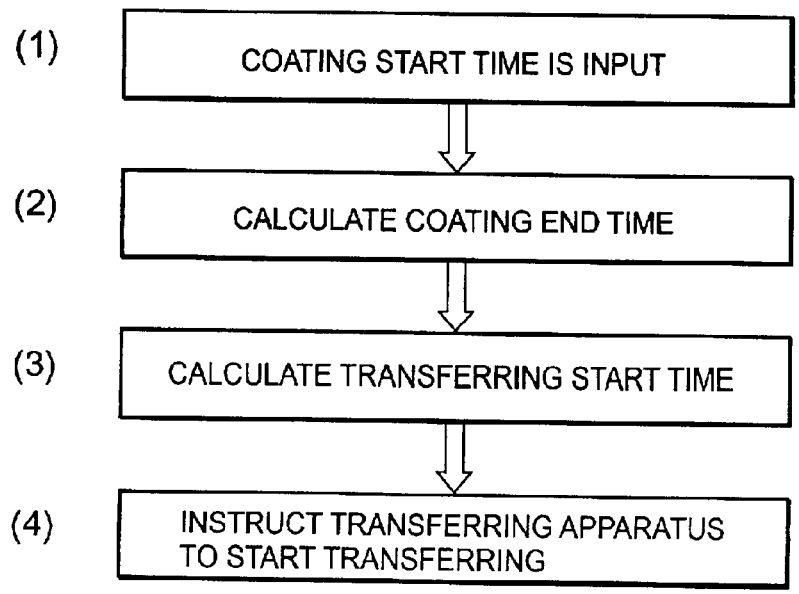
FIG. 7 is a view to explain an operation of the transferring apparatus controller.
Figure 8:
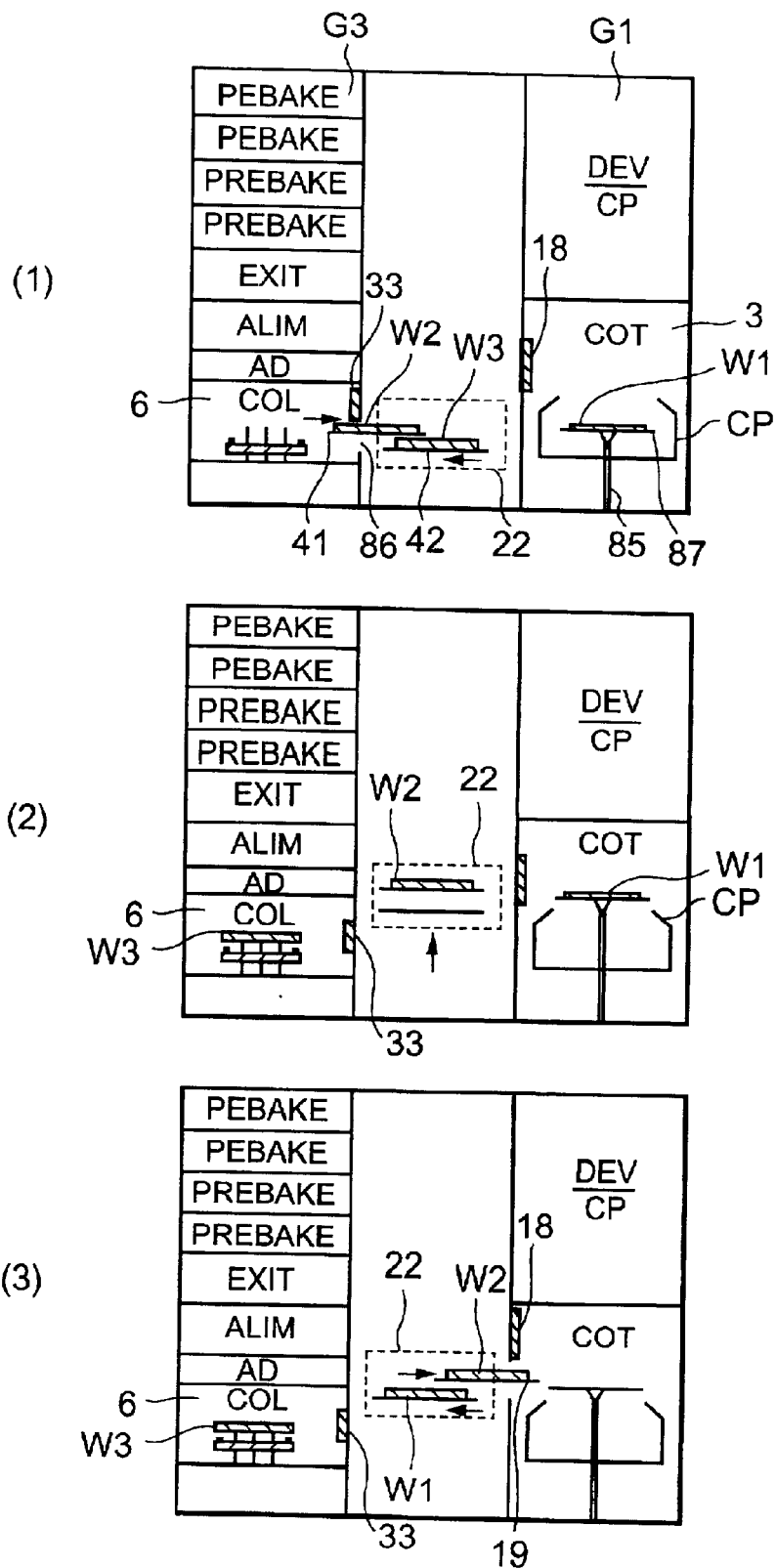
FIG. 8 is a view showing a transferring process of wafer between the resist liquid coating unit and the cooling process unit by use of the transferring apparatus.

The transfer timing is controlled by the transferring apparatus controller 126 for controlling the movement of the transferring apparatus, and the specific operation of the transferring apparatus will be explained using FIGS. 7 and 8. FIG. 7 is a view to explain an operation step of the transferring apparatus controller 126 at the time of transferring the wafer W. FIG. 8 is a schematic view showing the process in which the wafer W is transferred to the resist liquid coating unit (COL) 6 in the first process unit group 1 from the cooling process unit (COL) 6 in the third process unit group G3 and this wafer W is replaced with the wafer W previously subjected to the resist-film coating process in the resist liquid coating unit (COT) 3. Additionally, FIG. 8 explains the case in which the number of tweezers placed on the transferring base is two and the illustration of the dispenser and the like is omitted.

First, the action of the transferring apparatus controller will be explained.

As shown in FIG. 7(1), when the wafer W is transferred into the resist liquid coating unit (COT) 3 and the resist film is applied thereon, the coating start time is input to the transferring apparatus controller 126. Next, as shown in FIG. 7(2), the transferring apparatus controller 126 calculates the coating end time from the coating time inputted by storage section 92 beforehand and the input coating start time. Sequentially, as shown in FIG. 7(3), the transferring apparatus controller 126 calculates the time required for taking out the wafer W, which is next subjected to the coating process, from the cooling process unit (COL) 6 such that the wafer W, which is next subjected to the coating process, stands by before the resist liquid coating unit (COT) 3 at the time of ending the coating process of wafer W in the resist liquid coating unit (COT) 3. Then, as shown in FIG. 7(4), the transferring apparatus controller 126 instructs the transferring apparatus about timing to take out the wafer W based on the calculated time for taking out the wafer.

Next, the transfer of wafer W from the cooling process unit (COL) 6 to the resist liquid coating unit (COT) 3 will be explained using FIG. 8.

As shown in FIG. 8(1), in the resist liquid coating unit (COT) 3, a wafer W1 is fixed on a descended spin chuck base 87. The dispenser is positioned at the upper central portion of the wafer W1, and dispenses a resist film onto the surface of the wafer W1. Then, the spin chuck base 87 is rotated, so that the resist film is coated with the resist film. At the resist film coating time, the opening through which the wafer is loaded and unloaded is closed by the shutter member 18. As mentioned above, when the resist film coating to the wafer W1 is started, the coating start time is input to the transferring apparatus controller 126. The transferring apparatus controller 126 instructs the transferring apparatus 22 about timing to take out the wafer W from the cooling process unit (COL) 6. The shutter member 33 for closing the opening 86 through which the wafer W of the cooling process unit (COL) 6 moves up. The tweezers 41, which are placed on the transfer base of the transferring apparatus 22, insert into the cooling process unit (COL) 6 to pick up a wafer W2 in accordance with the instruction from the transferring apparatus controller 126. Thereafter, the tweezers 42 loads a wafer W3, which is next subjected to the cooling process, into the cooling process unit (COL) 6.

Next, as shown in FIG. 8(2), the wafer W2 is replaced with the wafer W3, thereafter the shutter member 33 of the cooling process unit (COL) 6 moves down to close the opening of the cooling process unit (COL) 6. The transfer base of the transferring apparatus 22, on which the wafer W2 is mounted, moves upwardly, and further moves rotatably in the η direction shown in FIG. 4. When the resist film coating process of wafer W is completed in the resist liquid coating unit (COT) 3, the wafer W2 is transferred to be positioned before the resist liquid coating unit (COT) 3. At this time, the transfer base is positioned to be moved substantially horizontally and to be inserted into the opening of the resist liquid coating unit (COT) 3. While, in the resist liquid coating unit (COT) 3, the resist liquid is applied onto the wafer W1. The spin chuck base 87, on which the wafer W1 is held, is moved up the hoisting and lowering mechanism 85 and the resist liquid coating end state is set. At this time, the dispenser (not shown) is horizontally moved by the moving mechanism 83 and is positioned at the outside of the cup CP. Here, the wafer W2 transferred by the transferring apparatus 22 may stand by before at least the resist liquid coating unit (COT) immediately before the replacement of wafer W is performed. The resist liquid coating end time indicates the duration between the time when the resist liquid coating is substantially ended and the time just before the replacement of the water is performed. The time just before the replacement of the wafer is preferable. In this case, the wafer W to be next processed can be processed in a suitable cooling state by the resist liquid process.

Then, as shown in FIG. 8(3), the shutter member 18 of the resist liquid coating unit (COT) moves up, so that the wafer W1 contained in the resist liquid coating unit (COT) is replaced with the wafer W2 transferred by the transferring apparatus 22.

In this way, the wafer W subjected to the resist liquid coating process in the resist liquid coating unit (COT) 3 is loaded into a predetermined pre-baking unit (PREBAKE) 5 in the third process unit group G3 or process unit group G4 by the transferring apparatus 22. The wafer W, here, is heated at a predetermined temperature, for example, 100° C. for a predetermined time to evaporate the remaining solvent from the coated film on the wafer W.

Thereafter, the wafer W is loaded into the extension/cooling process unit (EXTCOL) 17 in the fourth process unit group G4 by the transferring apparatus 22. Here, the wafer W is cooled to a predetermined temperature, which is suitable for the next process, that is, peripheral light-exposure process due to the peripheral light-exposure apparatus 24, for example, 23° C.

After that, the wafer carriage 25 provided to the interface section 25 takes out the wafer W from the extension/cooling process unit (EXTCOL) 17.

Next, the wafer carriage 25 loads the corresponding wafer W into the peripheral light-exposure apparatus 24 in the interface section 12. The peripheral portion of the wafer W is subjected to the light-exposure process. When the peripheral light-exposure process is completed by the peripheral light-exposure apparatus 24, the wafer carriage 25 unloads the wafer W from a peripheral light-exposure apparatus 28, and transfers it to the out-stage 15 of the wafer receiving base 14 provided at the adjacent light-exposure apparatus 13. In this case, the wafer W is temporarily stored in the fixed buffer cassette BR as necessary before being transferred to the light-exposure apparatus 13 in some cases.

As mentioned above, after transferring the wafer W to the light-exposure apparatus 13, the wafer W is subjected to the light-exposure process, for example, one using a reticule. When the light-exposure process to the entire surface of the wafer W is completed, the wafer W is disposed on the in-stage 16 of the wafer receiving base 14.

Then, the wafer W is transferred to the process station 11 from the wafer carriage 25. In this case, the wafer W may be temporarily stored in the fixed buffer cassette BR as necessary before being transferred to the light-exposure apparatus 13.

Figure 11:
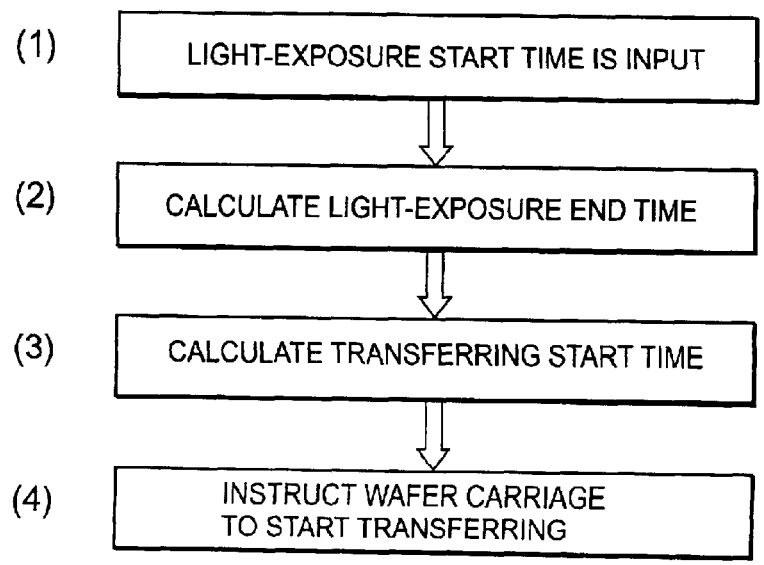
FIG. 11 is a view to explain an operation of the controller for wafer carriage.
Figure 12:
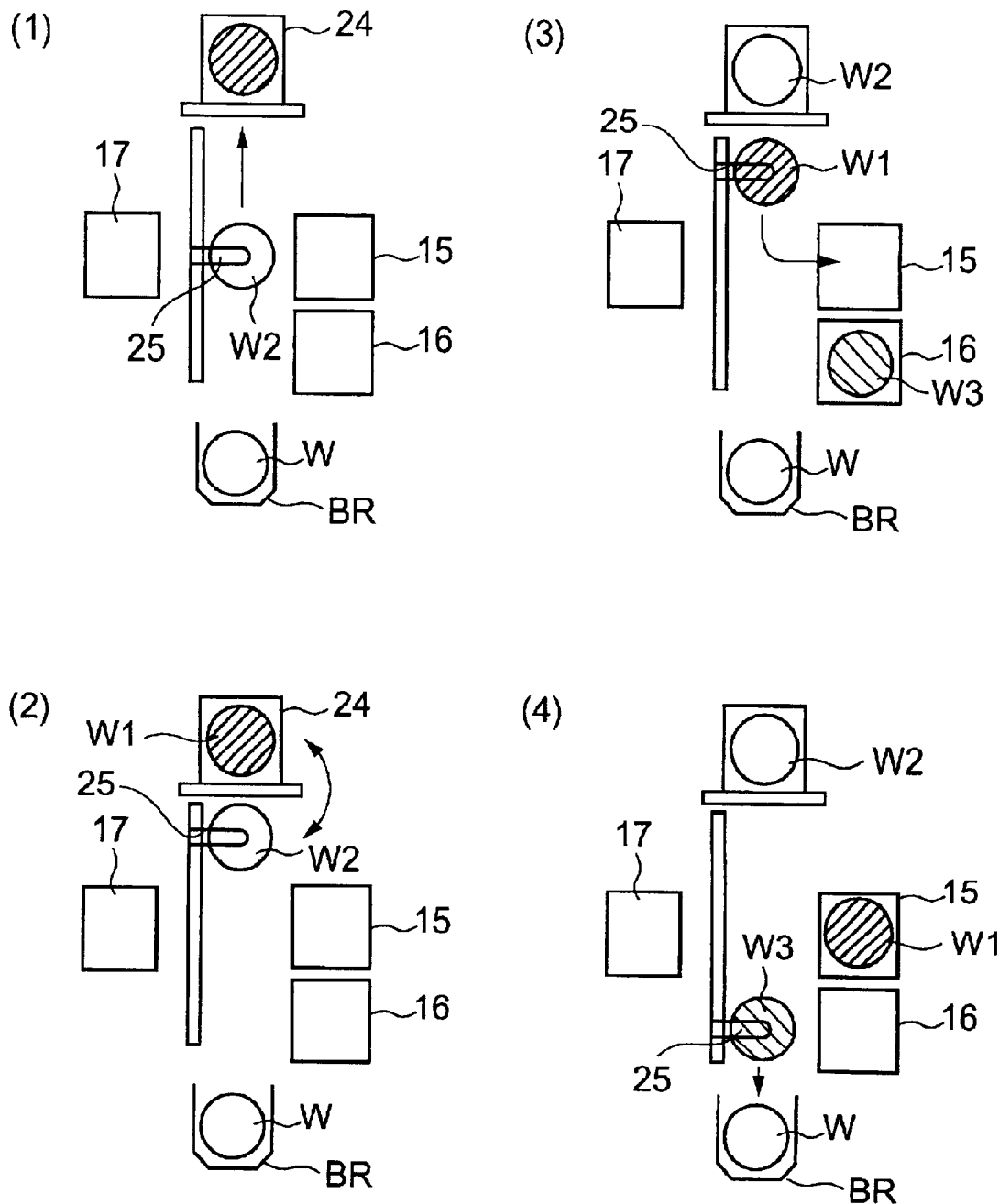
FIG. 12 is a view showing a transferring process of wafer W between a peripheral light-exposure apparatus and an extension and cooling process unit by use of the transferring apparatus.

Similar to the transfer between the cooling process unit (COL) 6 and the resist liquid coating unit (COT) 3, the transfer timing is also controlled in the case of the transfer between extension/cooling process unit (EXTCOL) 17 and the peripheral exposure apparatus 24. This control of transfer timing will be explained below:

The wafer W subjected to the cooling process by the extension/cooling process unit (EXTCOL) 17 is transferred such that the wafer W stands by before the peripheral light-exposure apparatus 24 at the time of the light-exposure of the wafer previously subjected to the light-exposure process in the peripheral light-exposure apparatus 24. This transfer timing is managed by the wafer carriage control means 34 for controlling the movement of the wafer carriage. The specific operation of the carriage will be explained with reference to FIGS. 11 and 12. FIG. 11 is a view showing the operation process of the wafer carriage control means when the wafer W is transferred. FIG. 12 is a view showing the process wherein the wafer W is transferred from the extension/cooling process unit (EXTCOL) 17 to the peripheral light-exposure apparatus 24 and the wafer W of the peripheral light-exposure apparatus 24 is replaced with new one and the wafer W is further transferred to the out-stage 15.

First, the action of the wafer carriage controller will be explained.

As shown in FIG. 11(1), when the wafer w is transferred to the peripheral light-exposure apparatus 24 and the peripheral light-exposure process is started, the peripheral light-exposure start time is input to the wafer carriage controller 34. Next, as shown in FIG. 11(2), the wafer carriage controller 34 calculates the peripheral light-exposure end time from the light-exposure time inputted by storage section 102 input beforehand and the input peripheral light-exposure start time. Sequentially, as shown in FIG. 11(3), the wafer carriage controller 34 calculates the time required for taking out the wafer W, which is next subjected to the coating process, from the extension/cooling cooling process unit (EXTCOL) 17 such that the wafer W, which is next subjected to the peripheral light-exposure process, stands by before the peripheral light-exposure apparatus 24 at the time of ending the peripheral light-exposure process of the wafer W in the peripheral light-exposure apparatus 24. Then, as shown in FIG. 11(4), the wafer carriage controller 34 instructs the wafer carriage about timing to take out the wafer W based on the calculated time for taking out the wafer.

Next, the transfer of wafer W from the extension/cooling process unit (EXTCOL) 17 to a peripheral light-exposure apparatus 24 will be explained using FIG. 12.

First, as shown in FIG. 12(1), in the peripheral light-exposure apparatus 24, the wafer W1 is subjected to the light-exposure process. As mentioned above, when the peripheral light-exposure process to the wafer W1 is started, the peripheral light-exposure start time is input to the wafer carriage controller 34. Then, the wafer carriage controller 34 instructs the wafer carriage 25 about the timing to take out the wafer W from the extension/cooling process unit (EXTCOL) 17. When the instruction to take out the wafer W is sent, the shutter member (not shown) for closing the opening through which the wafer W of the extension/cooling process unit (EXTCOL) 17 is passed is opened, and the wafer carriage 25 takes out the wafer W2 from the extension/cooling process unit (EXTCOL) 17.

Next, as shown in FIG. 12(2), the wafer carriage 25 transfers the wafer W2 before the peripheral light-exposure apparatus 24. The wafer w2 is transferred such that the wafer W2 is positioned before the peripheral light-exposure apparatus 24 at the time of ending the light-exposure process of wafer W1 in the peripheral light-exposure apparatus 24. After ending the light-exposure of the wafer W1, the wafer w1 in the peripheral light-exposure apparatus 24 is replaced with the wafer W2 transferred by the wafer carriage 25.

Then, as shown in FIG. 12(3), the wafer W2 subjected to the peripheral light-exposure process is transferred to, for example, the out-stage 15 by the wafer carriage 25, and is mounted thereon. A wafer W3 subjected to the light-exposure process by the light-exposure apparatus (not shown) is placed on the in-stage 16. The wafer carriage 25 receives the light-exposed wafer W3 placed on the in-stage 16, and transfers it into, e.g., the fixed buffer cassette BR as shown in FIG. 12(4).

The light-exposed wafer W contained in the buffer cassette BR is loaded into a predetermined post-exposure baking unit (PEBAKE) 50 of the processing station 11 by the carriage 25. In the post-exposure baking unit (PEBAKE) 50, the wafer W is placed on a heat plate and subjected to a baking process for a predetermined time.

Thereafter, the baked wafer W is loaded into any one of cooling process units (COL) 6 by the transferring apparatus 22, and the temperature of the wafer W is returned to room temperature in the cooling process unit (COL) 6. Sequentially, the wafer W is loaded into a predetermined developing process unit (DEV) 2 by the transferring apparatus 22.

In the developing process unit (DEV) 2, the wafer W is mounted on the spin chuck, and a developing solution is uniformly injected onto the resist of the surface of wafer W in a spray system so as to perform development. After the development, a rinsing solution is injected onto the surface of the wafer W to wash out the developing solution. Thereafter, the wafer W is rotated at high speed to be dried.

After that, the wafer transferring apparatus 22 unloads the wafer W2 from the developing process unit (DEV) 2 and loads it to a predetermined post-baking unit (POBAKE) 4 again. In the post-baking unit (POBAKE) 4, the wafer W is heated at 100° C. for a predetermined time. By the post-baking, the wafer W, which has been swollen by the developing solution, is cured. The chemical resistance is thereby improved.

After the post-baking process, the wafer transferring apparatus 22 unloads the wafer W from the post-baking unit and loads it into a predetermined cooling process unit (COL) 6, and the loaded wafer W is subjected to the cooling process.

After the temperature of the wafer W is returned to the room temperature, the wafer transferring apparatus 22 delivers the wafer W to the cassette station 10. The wafer carriage 21 of the cassette station 10 places the received wafer W in the wafer mounting section CR on the cassette mounting table 20.

As explained above, according to the present embodiment, the timing to transfer the wafer W is controlled by the controller at the time of transferring the wafer W between the extension/cooling process unit (EXTCOL) 17 and the peripheral light-exposure apparatus 24 and the wafer W between the cooling process unit (COL) 6 and the resist liquid coating unit (COT). Namely, the transfer of the wafer from the cooling process unit is controlled such that the next wafer W stands by before the process unit at the time of ending the process of the wafer W in the process unit (resist liquid coating unit, developing process unit). This makes it possible to shorten the entire processing time and to improve the throughput efficiently as compared with the prior art.

An explanation will be given of a difference in processing time caused by a difference in timing to transfer the wafer W between the prior art and the present embodiment with reference to FIGS. 9 and 13. FIG. 9 is a view explaining a difference in timing to transfer a wafer W between the cooling process unit (COL) 6 and the resist liquid unit (COT) 3. FIG. 13 is a view explaining a difference in timing to transfer a wafer W between the extension/cooling process unit (EXTCOL) 17 and the peripheral light-exposure apparatus 24.

First, the timing to transfer the wafer W between the cooling process unit (COL) 6 and the resist liquid coating unit (COT) 3 will be explained using FIG. 9. FIG. 9A is a view explaining the timing to transfer in the present embodiment, and FIG. 9B is a view explaining the timing to transfer in the prior art. Each explains the action of the transferring apparatus and that of the resist liquid coating unit (COT) 3 in a time series, and a horizontal direction in the figure corresponds to a time axis.

As shown in FIG. 9A, in this embodiment, while the wafer W is subjected to the resist-film coating process in the resist liquid coating unit (COT) (C1 in this figure), the transferring apparatus 22, which stands by before the cooling process unit (COL) (A1) takes out the wafer W to be next subjected to the coating process in the cooling process unit (COL) (A2). Then, the transferring apparatus 22 transfers the wafer W before the resist liquid coating unit (COT) (A3). The wafer W, which is next subjected to the process, is held by the transferring apparatus 22, and the wafer W is replaced with the wafer W contained in the resist liquid coating unit (COT) (A4, C2). After the replacement of the wafer, the transferring apparatus 22 transfers the wafer W subjected to the coating process to a next module, which is a pre-baking unit (PREBAKE) (A5). While, in the cooling unit (COT), the transferred wafer W is subjected to the coating process.

In contrast, according to the prior art, as shown in FIG. 9B, after the resist liquid coating process in the resist liquid coating unit (COT) (C'1 in the figure) is ended, the transferring apparatus 22, which stands by before the cooling process unit (A'1) takes out the wafer W to be next subjected to the coating process in the cooling process unit (COL) (A'2). Until the wafer W to be next subjected to the coating process is transferred before the resist liquid coating unit (COT) after the end of the resist liquid coating, the resist liquid coating unit (COT) 3 waits for the replacement of the wafer (C'2). The extracted wafer W, which is next subjected to the coating process, is transferred before the resist liquid coating unit (COT) (A'3). Then, the wafer W is replaced with the wafer W contained in the resist liquid coating unit (COT) (A'4, C'3). After the replacement of the wafer, the transferring apparatus 22 transfers the wafer W subjected to the coating process to a next module, which is a pre-baking unit (PREBAKE) (A'5). While, in the resist film coating process unit (COT), the transferred wafer W is subjected to the coating process (C'4).

In comparison between FIG. 9A and FIG. 9B, there is no state in which the resist liquid coating unit (COT) 3 waits for the replacement of the wafer (C'2) unlike the prior art. Therefore, the start when the wafer W is next subjected to the coating process in the resist film coating process unit (COT) (C3, C'4 in the figure) is faster than the prior art. This makes it possible to shorten the entire process time.

The timing to transfer the wafer W between the peripheral light-exposure apparatus (WEE) 24 and the extension/cooling process unit (EXTCOL) 17 will be next explained with reference to FIG. 13. FIG. 13A is a view explaining the timing to transfer in the present embodiment, and FIG. 13B is a view explaining the timing to transfer in the prior art. Each explains the action of the wafer carriage 25 and that of the peripheral light-exposure apparatus 24 in a time series, and a horizontal direction in the figure corresponds to a time axis.

As shown in FIG. 13A, in this embodiment, while the wafer W is subjected to the light-exposure process in the peripheral light-exposure apparatus (WEE) 24 (W1 in this figure), the wafer carriage 25, which stands by before the extension/cooling process unit (EXTCOL) 17 (B1), takes out the wafer W to be next subjected to the coating process in the extension/cooling process unit (EXTCOL) 17 (B2). Then, the wafer carriage 25 transfers the wafer W before the peripheral light-exposure apparatus (WEE) 24 (A3). The wafer W, which is next subjected to the process, is held by the wafer carriage 25, and the wafer W is replaced with the wafer W contained in the peripheral light-exposure apparatus (WEE) 24. (B4, W2). After the replacement of the wafer, the wafer carriage 25 transfers the wafer W subjected to the coating process to the out-stage (B5) and moves to the in-stage. While, in the extension/cooling unit (EXTCOL), the transferred wafer W is subjected to the peripheral light-exposure process.

In contrast, according to the prior art, as shown in FIG. 13B, after the peripheral light-exposure process in the peripheral light-exposure apparatus (WEE) 24 (B'1 in the figure) is ended, the wafer carriage 25, which stands by before the extension/cooling process unit (EXTCOL) (B'1), takes out the wafer W to be next subjected to the coating process in the extension/cooling process unit (EXTCOL) (B'2). Until the wafer W to be next subjected to the coating process is transferred to the peripheral light-exposure apparatus (WEE) 24 after the end of the peripheral light-exposure process, the peripheral light-exposure apparatus (WEE) 24 waits for the replacement of the wafer W (B'2). The extracted wafer W, which is next subjected to the peripheral light-exposure process, is transferred before the peripheral light-exposure apparatus (B'3). Then, the wafer W is replaced with the wafer W contained in the light-exposure (B'4, W'3). After the replacement of the wafer, the wafer carriage 25 transfers the wafer W subjected to the coating process to the out-stage and moves to the in-stage (B'5). While, in the peripheral light-exposure apparatus (WEE) 24, the transferred wafer W is subjected to the peripheral light-exposure process (W'4).

In comparison between FIG. 13A and FIG. 13B, there is no state in which the peripheral light-exposure apparatus (WEE) 24 waits for the replacement of the wafer (W'2) unlike the prior art. Therefore, the start when the wafer W is next subjected to the peripheral light-exposure process in the peripheral light-exposure apparatus (WEE) 24 (W3, W'4 in the figure) is faster than the prior art. This makes it possible to shorten the entire process time.

In addition, it is possible to further add auxiliary cooling means to the aforementioned resist liquid coating unit (COT) or peripheral light-exposure apparatus. For example, it is assumed that an unexpected waiting state of the wafer W occurs when the wafer W to be next processed is rendered to stand by before the resist liquid coating unit (COT) or the peripheral light-exposure apparatus. The use of auxiliary cooling means makes it possible to maintain the temperature of the wafer W at the suitable room temperature around 23° C. in performing the process in the resist liquid coating unit (COT) or the peripheral light-exposure apparatus. More specifically, as the auxiliary cooling means, a cooling process unit may be placed at the stage just under the resist liquid coating unit (COT) or the peripheral light-exposure apparatus to be adjacent to each other. The placement of the cooling process unit in the lower stage makes it easy to manage the temperature as compared with that of the cooling process unit in the upper stage. Or, it is possible to add a coolant gas supply nozzle to the external portion of the aforementioned resist liquid coating unit (COT) or peripheral light-exposure apparatus. From the coolant gas supply nozzle, a coolant gas may be sprayed on the wafer W, which is in a standby state.

The above embodiment has explained the case using the wafer W as a substrate. The present invention can be, however, applied to other substrates such as an LCD and the like.

Further, the present invention is not limited to the embodiment described above and can be variously modified within the technical scope of the present invention. For example, it is possible to control the timing to transfer the wafer W between the cooling process unit, which provides the cooling process prior to the developing process, and the developing process unit. In this way, control of the timing to transfer the wafer W allows the processing time to be shortened as the need for providing the cooling process beforehand comes about before the process such as the coating or developing.

Figure 14:
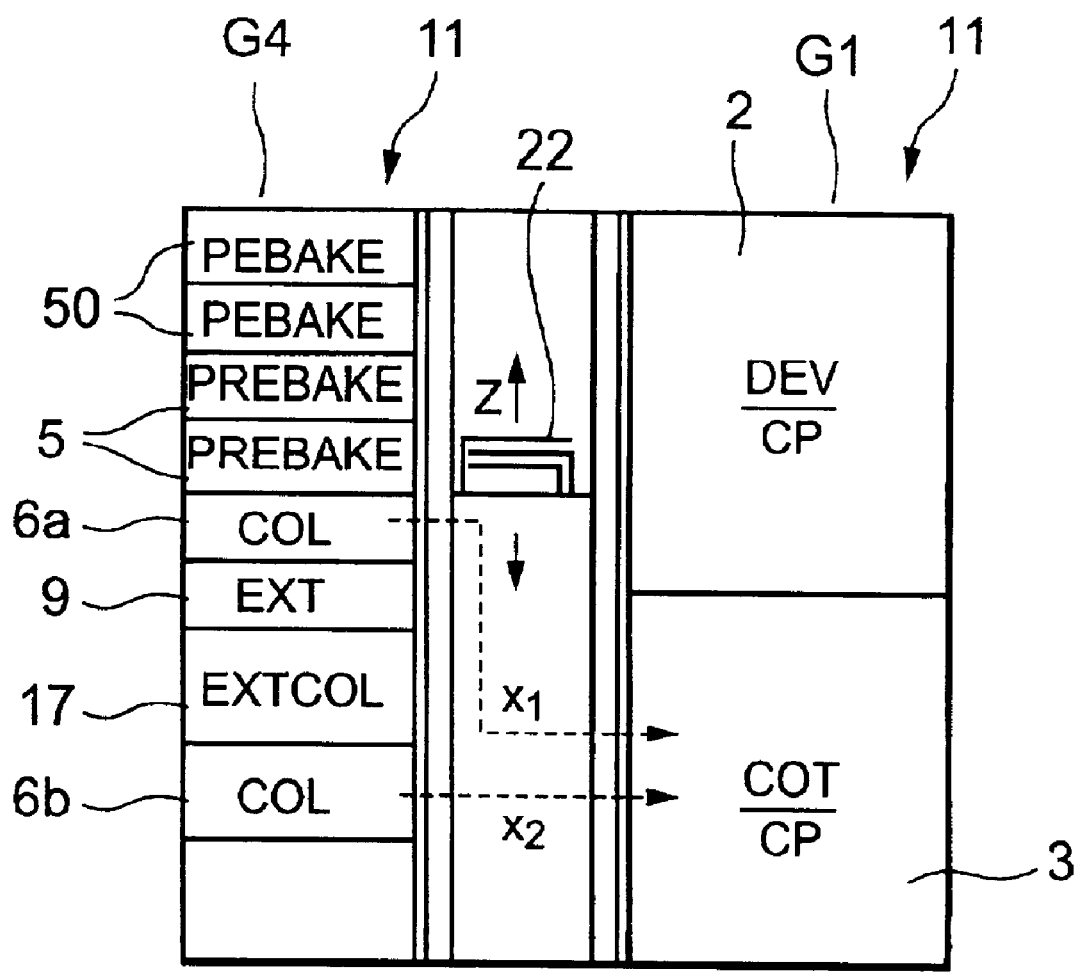
FIG. 14 is a schematic cross-sectional view to explain another embodiment of the present invention.

Still further, as shown in FIG. 14, there is a case in which a transfer distance x1 between a cooling process unit (COL) 6a and the resist liquid coating unit (COT) 3 is different from a transfer distance x2 between a cooling process unit (COL) 6b and the resist liquid coating unit (COT) 3 (for example, x1>x2). In such a case, control set forth below may be performed such that time T, which is from the unload of wafer W in the cooling process unit (COL) 6a to the load of wafer W in the resist liquid coating unit (COT) 3, substantially coincides with time T, which is from the cooling process end of wafer W in the cooling process unit (COL) 6b to the load of wafer W in the resist liquid coating unit (COT) 3. Namely, the timing to load/unload the wafer W in the cooling process unit (COL) 6b may be delayed by a predetermined time T1. To perform such control, the transferring apparatus 22 may be controlled by the transferring apparatus controller 126. Thus, control of the transferring time makes the heating history of wafer W more uniform, and this allows the film thickness and the like to be managed more correctly. Additionally, instead of delaying the timing to transfer, the transfer rate of the transferring apparatus may be variably set to perform the aforementioned time control. For example, the transfer rate of wafer w from the cooling process unit 6b to the resist liquid coating unit (COT) 3 may be intentionally delayed.

Still further, there is a case in which the transferring apparatus 22 must perform the transfer of wafer W to the cooling process unit (COL) from the unit of the heating process unit and the transfer of wafer W to the resist liquid coating unit (COT) from the cooling process in it (COL) at substantially the same time. In view of the uniformity of the heating history of wafer W, the transferring apparatus controller 126 should preferably place a high priority on the transfer of wafer W to the cooling process unit (COL) from the unit of the heating process system. The reason is that there is a high possibility that an adverse influence will be exerted on the heating history if the wafer W is rendered in the standby state in the unit of the heating process system.

As explained above, the timing to transfer the wafer from the cooling process unit is controlled such that the wafer to be next processed stands by before the process unit at the time of ending the process of the wafer W in the process unit, which performs the resist liquid coating process or the developing process. This makes it possible to shorten the entire processing time and to improve the throughput.

The disclosure of Japanese Patent Application No. 11-321735 filed Nov. 11, 1999 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing apparatus comprising:

a cooling process unit section for performing a cooling process to a substrate;

a liquid process unit section for supplying a predetermined liquid onto the substrate subjected to the cooling process to perform a liquid process;

a transferring apparatus for transferring the substrate from at least the cooling process unit section to the liquid process unit; and control means for controlling the transfer of the substrate by the controlling apparatus such that a substrate, which is subjected to a next liquid process, stands by before the liquid process unit section at the time of ending the liquid process of the substrate in the liquid process unit.

2. The substrate processing apparatus according to claim 1, wherein the control means inputs a liquid process time required for the liquid process and a moving time required for movement of the transferring apparatus from the cooling process unit section to the liquid process unit section beforehand, when a liquid process start time of the substrate in the liquid process unit section is inputted, the control means calculates a liquid process end time from the start time and the liquid process time, and the control means calculates a moving start time of the transferring apparatus for transferring the substrate, which is subjected to the next liquid process, from the liquid process end time and the moving time to transmit the moving start time to the transferring apparatus.

3. The substrate processing apparatus according to claim 1, wherein the liquid process unit section has an opening through which the substrate is loaded and unloaded, and an open/close shutter member for closing the opening.

4. The substrate processing apparatus according to claim 3, wherein the opening is closed by the shutter member during the liquid process, and the opening is opened by the shutter member at the end of the liquid process.

5. The substrate processing apparatus according to claim 1, further comprising a heating process unit section for performing a heating process to the substrate, wherein the transferring apparatus transfers the substrate to the cooling process unit section from the heating process unit section, and the control means controls the transferring apparatus to place a higher priority on the transfer of the substrate to the cooling process unit section from the heating process unit section than the transfer of the substrate to the liquid process unit section from the cooling process unit section.

6. A substrate processing apparatus comprising:
- a first process unit group having processing units, which includes at least a first cooling process unit section for performing a cooling process to a substrate, arranged in the form of multiple-stage vertical array;
- a second process unit group having liquid process unit sections for supplying a predetermined liquid onto the substrate to perform a liquid process arranged in the form of multiple-stage vertical array;
- a transferring apparatus for transferring the substrate from at least the cooling process unit section to the liquid process unit section; and
- control means for controlling the transfer of the substrate by the controlling apparatus such that a substrate, which is subjected to a next liquid process, stands by before the liquid process unit section at the time of ending the liquid process of the substrate in the liquid process unit.

7. The substrate processing apparatus according to claim 6, further comprising a second cooling process unit section, which is placed at a position different from the first cooling process unit section, for performing a cooling process to the substrate, wherein the control means controls the transferring apparatus such that a first time at which the substrate is transferred from the first cooling process unit section to the liquid process section substantially coincides with a second time at which the substrate is transferred from the second cooling process unit section to the liquid process unit section.

8. The substrate processing apparatus according to claim 7, wherein the control means controls timing at which the transferring apparatus unloads the substrate from the first cooling process unit section and timing at which the transferring apparatus unloads the substrate from the second cooling process unit section such that the first time and the second time substantially coincide with each other.

9. A substrate processing apparatus comprising:
- a cooling process unit section for performing a cooling process to a substrate on which a resist film is formed;
- a light-exposure process unit section for performing a light-exposure process to the resist film of the substrate subjected to the cooling process;
- a transferring apparatus for transferring the substrate from at least the cooling process unit section to the light-exposure process unit section; and
- control means for controlling the transfer of the substrate by the controlling apparatus such that a substrate, which is subjected to a next light-exposure process, stands by before the liquid process unit section at the time of ending the light-exposure process of the substrate in the light-exposure process unit.

10. The substrate process apparatus according to claim 9, wherein the control means inputs a light-exposure process time required for the light-exposure process and a moving time required for movement of the transferring apparatus from the cooling process unit section to the light-exposure process unit section beforehand, when a liquid process start time of the substrate in the light-exposure process unit section is inputted, the control means calculates a light-exposure process end time from the start time and the light-exposure process time, and the control means calculates a moving start time of the transferring apparatus for transferring the substrate, which is subjected to the next liquid process, from the light-exposure end time and the moving time to transmit the moving start time to the transferring apparatus.

11. A substrate processing apparatus comprising
- a process unit group having processing units, which includes at least a cooling process unit section for performing a cooling process to a substrate on which a resist film is formed, arranged in the form of multiple-stage vertical array;
- a light-exposure process unit section for performing a light-exposure process to the resist film of the substrate subjected to the cooling process;
- a transferring apparatus for transferring the substrate from at least the cooling process unit section to the light-exposure process unit section; and
- control means for controlling the transfer of the substrate by the controlling apparatus such that a substrate, which is subjected to a next light-exposure process, stands by before the liquid process unit section at the time of ending the light-exposure process of the substrate in the light-exposure process unit.

12. A substrate processing method comprising the step of:
- performing a cooling process to a first substrate in a cooling process unit section;
- supplying a predetermined liquid onto the first substrate subjected to the cooling process to perform a liquid process in a liquid process unit section;
- performing a cooling process to a second substrate in the cooling process unit section;
- transferring the second substrate by a transferring apparatus such that the second substrate subjected to the cooling process stands by before the liquid process unit section at the time of ending the liquid process of the first substrate; and
- unloading the first substrate from the liquid process unit section to load the second substrate to the liquid process unit section.

13. The substrate processing method according to claim 12, further comprising the steps of:
- closing an opening of the liquid process unit section by a shutter member during the liquid process; and
- opening the shutter member, which has closed the opening, at the time of ending the liquid process.

14. A substrate processing method comprising the steps of:
- performing a cooling process to a first substrate on which a resist film is formed in a cooling process unit section;
- light-exposing the resist film of the first substrate subjected to the cooling process;
- performing a cooling process to a second substrate on which a resist film is formed in the cooling process unit section;
- transferring the second substrate by a transferring apparatus such that the second substrate subjected to the cooling process stands by before the light-exposure process unit section at the time of ending the light-exposure process of the first substrate; and
- unloading the first substrate from the light-exposure process unit section to load the second substrate to the light-exposure process unit section.

* * * * *